United States Patent
Briand et al.

(10) Patent No.: US 6,841,249 B2
(45) Date of Patent: Jan. 11, 2005

(54) METHOD OF A DIAMOND SURFACE AND CORRESPONDING DIAMOND SURFACE

(75) Inventors: Jean-Pierre Briand, Antony (FR); Nicolas Bechu, Paris (FR); Alix Gicquel, Levallois Perret (FR); Jocelyn Achard, Enghien les Bains (FR)

(73) Assignee: Universite Pierre et Marie Curie, Paris (FR)

(*) Notice: Subject to any disclaimer, the term of this patent is extended or adjusted under 35 U.S.C. 154(b) by 0 days.

(21) Appl. No.: 10/182,712
(22) PCT Filed: Feb. 7, 2001
(86) PCT No.: PCT/FR01/00360
§ 371 (c)(1), (2), (4) Date: Nov. 24, 2002
(87) PCT Pub. No.: WO01/59817
PCT Pub. Date: Aug. 16, 2001

(65) Prior Publication Data
US 2003/0118828 A1 Jun. 26, 2003

(30) Foreign Application Priority Data
Feb. 9, 2000 (FR) .............................. 00 01604

(51) Int. Cl.$^7$ ................................. H01L 21/04
(52) U.S. Cl. ..................... 428/408; 428/457; 427/331
(58) Field of Search .................. 428/408, 457; 427/331, 249; 313/310, 336, 351, 309; 445/50, 51

(56) References Cited

U.S. PATENT DOCUMENTS

| 5,141,460 A | * | 8/1992 | Jaskie et al. |
| 5,399,238 A | * | 3/1995 | Kumar |
| 5,608,283 A | * | 3/1997 | Twichell et al. |
| 5,628,659 A | * | 5/1997 | Xie et al. |
| 5,703,435 A | * | 12/1997 | Kumar et al. |
| 5,713,775 A | * | 2/1998 | Geis et al. ............... 445/35 |
| 5,729,094 A | * | 3/1998 | Geis et al. ............... 257/77 |
| 5,952,772 A | * | 9/1999 | Fox et al. ............... 257/77 |
| 6,097,139 A | * | 8/2000 | Tuck et al. |

FOREIGN PATENT DOCUMENTS

| FR | 2 757 881 | 7/1998 |
| FR | 2 764 110 | 12/1998 |

OTHER PUBLICATIONS

Watanabe H et al: "Effect of Ion Implantation on Ion–Plated Diamond–Like Carbon Films" Diamond and Related Materials, NL, Elsevier Science Publishers, Amsterdam, vol. 3, No. 8, Jun. 1, 1994, pp. 1117–1119, XP000483456 ISSN: 0925–9635 le document en entier.

* cited by examiner

Primary Examiner—Archene Turner
(74) Attorney, Agent, or Firm—Arent Fox, PLLC

(57) ABSTRACT

The invention relates to a treatment method of a diamond surface and to a corresponding diamond surface (5A).

According to the method, ions are produced, each having at least three positive charges, and a beam of these ions is sent towards a diamond surface in order to make at least one zone of the surface conductive under the effect of said ions. Advantageously, conductive islands (6) are formed with a diameter smaller than 150 nm, then used preferably as one electron tank (diameter smaller than 10 nm) or as replenishment reservoirs for cold cathodes.

Application to micro-electronics and to the production of cold cathodes.

27 Claims, 3 Drawing Sheets

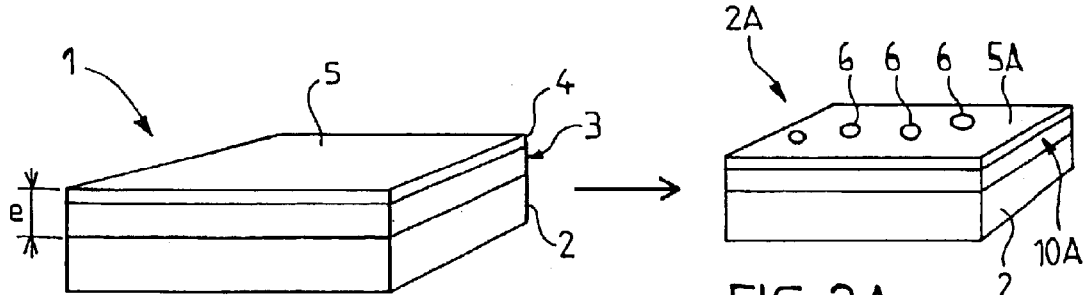
FIG.1
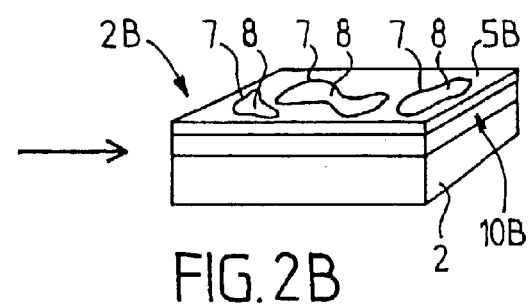
FIG.2A
FIG.2B
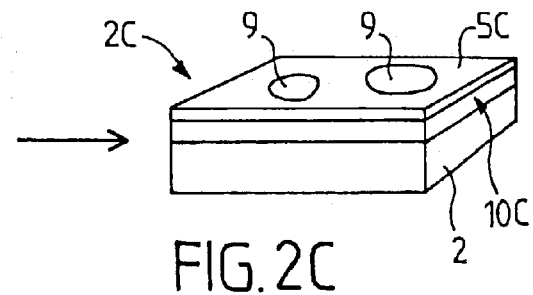
FIG.2C
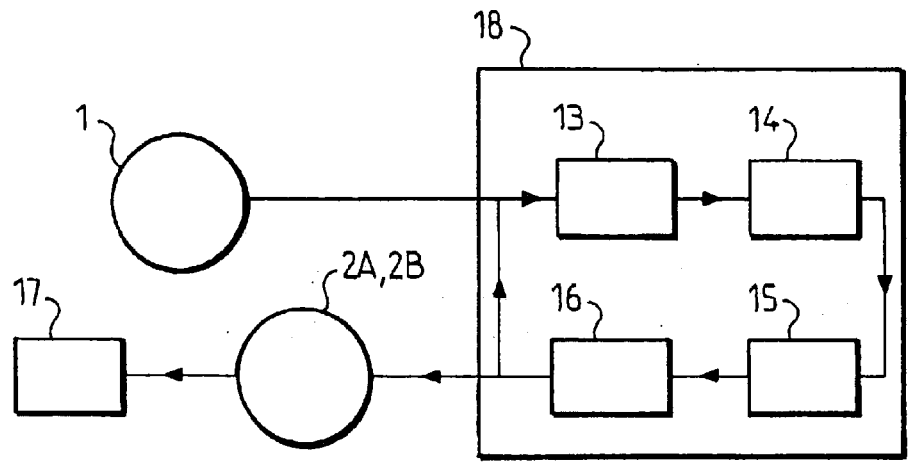
FIG.3

METHOD OF A DIAMOND SURFACE AND CORRESPONDING DIAMOND SURFACE

This invention relates to a surface treatment method wherein:
- ions are produced, each having at least three positive charges, and
- a beam of these ions is sent to the surface.

The invention also relates to a corresponding diamond surface and to applications of such method or of such surface.

A method of the type mentioned above has been described in the international applications WO-98/29901 and WO-98/54747.

More precisely, the document WO-98/29901 relates to a structure modification without the ions contacting a surface of a semi-conductor, in order to create insulating zones on this surface.

The document WO-98/54747 describes, for its own part, an ion etching technique. In a particular embodiment disclosed in this document (see claim 8), the beam is sent towards a semi-conductor or an insulating material and the electrical or chemical nature or the topography of the surface is modified locally by such beam, without the beam contacting the surface.

This invention concerns a technique enabling to form conductive zones on an insulating surface, thereby surprisingly causing only an ion beam to be sent. The invention concerns such a technique enabling to form such controllable and small-sized zones.

The invention therefore relates to a treatment method of an insulating surface enabling to make at least one zone of this surface conductive, implementing against all odds the sending of an ion beam towards the surface.

The invention also concerns an insulating surface delineating conductive islands with a diameter smaller than 10 nm, which can be obtained by the treatment method of the invention.

The invention also relates to applications of this technique to micro-electronics, for the realisation of one electron tanks, and to the production of cold cathodes, notably for flat screens.

To this effect, the purpose of the invention is a surface treatment method wherein:
- ions are produced, each having at least three positive charges, and
- a beam of these ions is sent to the surface.

According to the invention, the beam is sent towards a diamond surface, in order to make at least one zone of the surface conductive under the effect of these ions, each ion having a charge, a kinetic energy and an incidence such that it generates local structural modifications of the surface, each having a surface area greater than 4 atomic surfaces and preferably 10 atomic surfaces, of said diamond and smaller than 22,500 nm$^2$.

By "diamond" is meant not only a natural or artificial diamond (prepared for example by a CVD—Chemical Vapour Deposition—or HPHT (High Pressure High Temperature—method), polycrystalline or monocrystalline diamond, but also an "amorphous carbon sp3" (diamond like carbon), which has a link sp3 like diamond, but another crystallographic structure. The diamond surface is advantageously prepared as a thin layer on a substrate made of silicium preferably.

It is particularly surprising that sending an ion beam towards an insulating surface, composed of diamond (i.e. pure crystallised carbon in a diamond structure) may cause local stable formation of conductive zones. This effect is due to a physical phenomenon unexplored so far, according to which the structure of the diamond can be modified over a small surface into a conductive allotropic variety, by one or several singular ions. Indeed, carbon exhibits several crystalline allotropic shapes comprising notably diamond (insulating form) and graphite (conductive form), and one ion having at least three positive charges is capable of causing in a diamond surface a large defect with respect to atomic dimensions, but small in size macroscopically. Such an ion generates within the diamond surface massive excursion of electrons enabling to obtain this result.

By contrast, for example, the technique described in the document WO-98/54747 rests on the expulsion of atoms present in the molecules of the surface in question (see in particular page 8, lines 7–19) and is therefore very different in its purpose and in its application of the method of this invention.

The operations with the ion beams are performed preferably under vacuum. Thus vacuum may correspond to relatively high pressure, for example in the order of 10$^{-9}$ Pa. It may also be an ultra-vacuum.

The ions, each having at least three positive charges, are called multi-charged positive ions. The monocharged ions, for example, cannot produce the effect specified, consisting in the local creation of stable conductive zones at the surface of the diamond. Very energetic monocharged ions could a priori break locally crystallographic or chemical links when passing through any material. However, they would create only punctual surface defects in the order of atomic dimensions. Such depth defects of punctual surface do not enable to use conductive zones created. Notably, the defects produced have a tendency to be repaired naturally by thermal effects, so that later chemical treatment would be necessary to realise a stable conductive zone.

The conductive zones formed have conductive properties similar to those of graphite, which is explained by the structural modification of the diamond in order to change it into another non-diamond allotropic variety, characterised in particular by a loss of the crystalline nature of the diamond.

The method above is applicable to the formation of very small local conductive zones, such as conductive islands having a diameter smaller than 150 nm and preferably smaller than 10 nm, to the formation of conductive lines or of portions of conductive surfaces or to the structural modification of the whole surface of diamond.

The conductive zone generated by the impact of one of the ions of the beam has a determined surface and a determined depth on a diamond surface given by the charge, the kinetic energy and possibly the incidence of the ion.

By contrast, the monocharged ions can individually produce only defects with a surface area smaller than 10 atomic surfaces, and the massive sending of an ion beam can only lead to conductive surfaces much greater than 22,500 nm$^2$.

Below, by 'local structural modification' is meant a modification over a surface area in the range specified above.

In a first preferred embodiment with a local structural modification the beam is sent in order to form at least one conductive island with a diameter smaller than 150 nm.

Advantageously, the conductive islands have a diameter smaller than 10 nm and preferably ranging between 2 and 6 nm. The treatment method of the invention provides such an accurate local structural modification, each of the ions being able to form an island.

Then, the conductive islands are used preferably as one electron tanks. Said dots are particularly useful for their applications in micro-electronics.

In another example of this first embodiment, conductive islands are used as replenish reservoirs for cold cathodes. The size of the conductive islands is then advantageously greater than 10 nm, and still preferably greater than 100 nm.

According to a second preferred implementation, the beam is sent in order to form conductive lines delineating insulating patterns.

According to a third preferred embodiment, the beam is sent in order to make at least one fraction of the diamond surface conductive.

To do so, one resorts advantageously to a local structural modification of these surface fractions caused by a sweeping beam. This enables an accuracy corresponding to the dimension of the beam and to its guiding, i.e. conventionally smaller than one micron.

In a particular example of this third embodiment, the whole diamond surface is made conductive.

According to a preferred embodiment of local structural modification, said modification is performed at random. Thus, in particular, the first embodiment then consists in forming conductive islands distributed at random over the diamond surface, the number of conductive islands by surface unit being defined by the number of ions reaching this surface.

In another embodiment of local structural modification, said modification is performed along a preset scheme.

In particular, advantageously, the zones of the surface are treated selectively while sending the beam towards guiding means, while directing the beam towards the surface with the guiding means, and while performing repeatedly the following operations:

space-time detection of ion interactions of the beam with the surface, interruption of the beam, relative displacement of the surface in relation to the position of the beam, and reestablishment of the beam.

The relative displacement of the surface with respect to the position of the beam may imply a displacement of the surface or a displacement of the beam, by variation of their position or of their orientation. Then the local structural modification takes place in succession, zone after zone. In an embodiment variation, several beams are directed simultaneously towards the surface.

Space-time detection consists in identifying the positions as well as the moments of the interactions.

Proceeding in such a way enables to control the durations of exposure of the diamond surface and the relative displacements of this surface with respect to the ion beam. Such control provides very high reliability. Indeed, the local structural modification by ions implies random arrival of the ions on the target, from a spatial as well as a time-related viewpoint. The controlled local structural modification method as specified above enables to adjust the treatment to these random phenomena.

The international application WO-98/54747 contains a detailed description of several embodiments of such a method. All these embodiments are applicable to this invention, whereas the control of local structural modification of this state of the art is combined with the selection of a diamond surface and the use of ions each having at least three positive charges.

In particular, the following characteristics are implemented advantageously; separately or in all their technically possible combinations:

the ion beam between the ion source and the surface to be treated is localised spatially, preferably by means of one or several beam collimators, the position of the beam is controlled and is cooled down, monokinetic selection of the ions between the ion source and the surface to be treated is performed, the beam is interrupted by means of application of en electrical field substantially parallel to the surface to be treated, advantageously in combination with the use of a collimator, the guiding means comprise means of application of a magnetic field, deviating the ion beam by a certain angle, this magnetic field being preferably uniform and the angle of deviation preferably 90°, the guiding means comprise means of application of an electrical field generating an electrical deviation, the guiding means implement simultaneously a magnetic field and an electrical field combined, for example in a Wien filter, the surface is moved with respect to the position of the beam by means of at least one element selected among a piezoelectric quartz and a ceramic, moving the diamond surface with respect to the ion beam incident on this surface, the surface treated is checked for local topography and/or electrical conductivity, preferably by means of a tunnel effect and/or atomic force microscope, interaction of the ions with the surface to be treated without any contact between the beam and the surface, the space-time detection then comprises a detection technique selected among the following:

measurement of photons emitted during the passages of electrons extracted from one electronic layer of hollow atoms of the ion beam to another layer (preferably measurement of X-rays emitted), detection of electrons emitted by Auger effect by the hollow atoms, detection of the ions or hollow atoms properly speaking (preferably position, speed and charge of the backscattered hollow atoms), detection of ionised fragments of molecules of the treatment surface expelled under the effect of the interactions (separated atoms), detection of a sheaf of electrons emitted under the effects of the interactions, measurement of photons emitted by atoms from the diamond surface, and combination of several of these techniques.

The treatment method may imply remote interaction, by a potential effect, and/or an interaction with contact of the ion beam and of the diamond surface, liable to cause the penetration of the ions below the surface (kinetic effect).

Thus, in a first preferred interaction embodiment, the ion beam is sent so that it contacts the surface and penetrates it. So, the ions with an initial kinetic energy ranging between 5 eV/q and 500 keV/q are generated advantageously.

In a second interaction embodiment, the beam is applied a deceleration voltage close to the surface in order to confer to the ions of the beam a controlled average speed, whereas the ions extract electrons from the diamond atoms without contacting the surface and therefore modifying the links between these atoms.

Then, the ions are slowed down advantageously so that they have close to the surface a kinetic energy ranging between $5.10^{-2}$ eV/q and 5 eV/q.

This contact free interaction technique is described in detail in the international application WO-98/54747, in the case of an etching control, and in the international application WO-98/29901, for the formation of insulating zones on a semi-conductive surface. All these techniques disclosed and developed in both these previous applications must be transposed to this application, with the following adjustments: as regards the application WO-98/54747, the method must be specified for a beam of multicharged ions and a diamond surface. Besides, the current method is not limited to the control technique of local structural modification described in this previous application and is valid in particular for a random etching process. As regards the document WO-98/29901, the treatment method is applied to a diamond surface and, thus, conductive zones are produced on an insulating zone and not insulating zones on a semi-conductive surface.

According to a third interaction embodiment, the ions touch the surface, but without any violent shock, so that they cannot penetrate the surface and interact only in the uppermost portions of this surface.

In the third embodiment, the ions are slowed down advantageously until they reach a level of energy respectively smaller than 5 eV/q and 25 eV/q.

In a first advantageous embodiment of the diamond surface, said surface is a monocrystalline, artificial or natural diamond surface.

In a second advantageous embodiment, it is a polycrystalline diamond surface, preferably obtained by a CVD (Chemical Vapour Deposition) or a HPHT (High Pressure High Temperature) method. The diamond surface is then advantageously a layer deposited on a substrate, for example silicium.

The use of a polycrystalline diamond surface having monocrystals of various sizes, preferably CVD or HPHT, enables advantageously to increase the number of electrons available. Indeed, such a realisation enables to modify the fraction of the crystalline surface with respect to grain joints which are conductive, said joints being able to supply more electrons to their insulating neighbours.

The irradiation technique of such a surface also enables to control the conductive surface/insulating surface ratio a posteriori and in an industrially easy fashion.

These implementations with monocrystals of various sizes are particularly interesting for the production of cold cathodes, since they provide a replenishment with electrons.

In a third advantageous embodiment, this surface is an amorphous carbon sp3 surface.

Advantageously, the diamond surface is passivated by an atomic monolayer, preferably made of hydrogen or oxygen. This monolayer can be conductive, for example hydrogen, or insulating (example: oxygen). In another embodiment, the diamond surface is natural.

The invention also relates to a diamond surface delineating conductive islands with a diameter greater than 2 and preferably than 3 atomic distances and smaller than 10 nm, and preferably ranging between 2 and 6 nm.

The islands have advantageously conductive properties similar to that of graphite.

Such a surface can notably be obtained by the treatment method of the invention.

The invention also relates to the application of such a surface to micro-electronics, wherein one uses the conductive islands as one electron tanks.

The invention also relates to the application of the treatment method for the production of cold cathodes, notably for flat screens.

The invention will be illustrated and better understood using embodiments and modes of realisation of the invention specified below with reference to the appended drawings, wherein:

FIG. 1 shows a silicium wafer covered with a diamond layer;

FIG. 2A shows the wafer of FIG. 1 after application of the method of the invention according to a first embodiment;

FIG. 2B shows the wafer of FIG. 1 after application of the method of the invention according to a second embodiment;

FIG. 2C shows the wafer of FIG. 1 after application of the method of the invention to a third embodiment;

FIG. 3 is a flow chart of the different steps of the method according to the invention with controlled local structural modification, enabling to obtain a wafer such as that of FIG. 2A and FIG. 2B;

Figure 4:
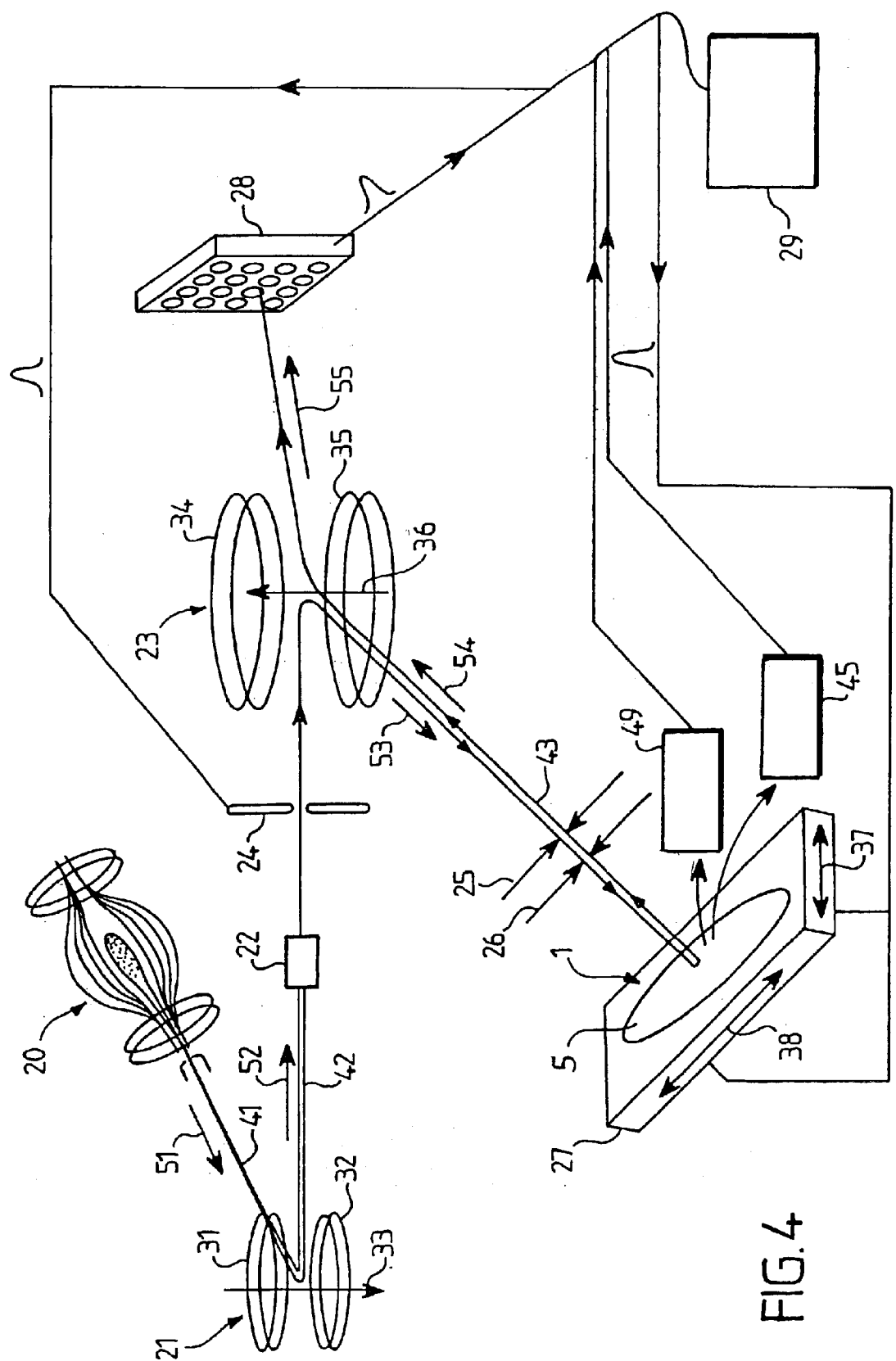
FIG. 4 represents an embodiment of a structural modification device enabling notably to apply the method with controlled local structural modification, whereof the main steps are schematised on FIG. 3.

A wafer 1 (FIG. 1) comprises a substrate 2 of silicium covered with a diamond layer 3 deposited on the substrate 2. The layer 3, having a thickness e for example ranging between 1 and 500 μm, is passivated by a hydrogen or oxygen monolayer 4. The layer 3 thus defines a surface 5, which represents the superficial portion of the wafer 1 occupied by the diamond layer 3. The diamond being a very good electrical insulating material, The layer 3 is very insulating under the monolayer 4.

The treatment method described below enables to transform the wafer 1 in three possible ways:
- into a wafer 2A whereon the surface 5A comprises a diamond layer 10A fitted with conductive islands 6 with very small sizes, smaller than 150 nm, advantageously smaller than 10 nm and preferably ranging between 2 and 6 nm (FIG. 2A);
- into a wafer 2B having a surface 5B comprising a diamond layer 10B wherein are drawn conductive lines 7 delineating insulating patterns 8 (FIG. 2B); or
- into a wafer 2C having a surface 5C comprising a diamond layer 10C wherein are formed conductive surface fractions 9 (FIG. 2C).

The first two realisations (wafers 2A and 2B) correspond to local selective surface treatment, whereas the third realisation (wafer 2C) can also be obtained by a local structural modification. A particular case of the third realisation is that whereon the surface is treated entirely. One of the extremely interesting particularities of the wafers 2A, 2B and 2C (apart from the treatment of the whole surface 5) is that very conductive zones, whereof the dimensions can be controlled perfectly, are close to very insulating zones. More precisely, the conductive islands 6 or the conductive lines 7, as well as the surface fractions 9, have electrical properties similar to those of graphite. According to the treatment methods leading to the wafers 2A, 2b and possibly 2C, a first embodiment of random local structural modification is advantageous very fast and a second embodiment of local structural modification, controlled spatially, is advantageously accurate.

The realisation of wafers of the type 2A is particularly interesting in the field of the microelectronics, since the conductive islands 6 whereof the diameter can be controlled sufficiently, can act as one electron tanks. Information can be stored in the wafer 1 according to the presence or not of an electron in each of these tanks.

The wafers of type 2A are also useful for the production of the cold cathodes. In such a case, the conductive islands 6 act as replenishment reservoirs of such cold cathodes.

The treatment method of the surface 5 will now be detailed in a particular embodiment, based upon the use of a specific local structural modification device represented on FIG. 4. This device enables to obtain any of the wafers 2A, 2B or 2C, enables random or spatially controlled treatment and makes an interaction possible between a beam of ions and the surface 5 with or without contact.

The local structural modification device comprises a source of ions 20 generating multicharged positive ions. The ion source 20 can use a preparation of the ions inside a very hot plasma confined in magnetic structures such as an ECR (Electron Cyclotron Resonance) source. It may also have as an operating principle the compression of electron beams in a solenoid, whereas atoms injected into the electron beam are ionised and trapped by a space charge simultaneously. The ion source 20 can thus be of the EBIS (Electron Beam Ion Source) type.

The ions emitted by the ion source 20 can be for instance argon, charged $Ar^{17+}$ or $Ar^{18+}$, oxygen or uranium. They can also be composed of lighter ions such as boron or carbon. The number of positive charges may vary from a few units to 92 for uranium.

The ion source 20 thus generates an ion beam 41 according to a first direction 51. The ions emitted have an initial kinetic energy in the order of several keV/q, for instance ranging between 5 and 20 keV/q, q designating the number of positive charges of each of these ions.

The beam 41 is directed towards means for selecting a chosen ionic specie, for example $Ar^{17+}$. The selecting means consist advantageously of first means of application 21 of a magnetic field 33, which comprises two opposite coils 31 and 32 or permanent magnets. The magnetic field 33 is advantageously uniform. It can also be non uniform in order to be focussing. The magnetic field 33 is advantageously perpendicular to the direction 51 of the incident beam 41. The selecting means thus generate a beam 42 of the ions selected in a direction 52. In controlled etching, the ions of the beam 42 are preferably sent one after the other. In random etching, they are sent to different places, each of the ions being capable of producing a print on the surface 5 for the formation of a conductive island 6.

In an embodiment variation, the selecting means are means of application of an electrical field.

The local structural modification device comprises preferably a direct position control system of the beam 42, referred to as 22.

The local structural modification device comprises then means for interrupting the beam 42, comprising advantageously an electronically operated beam shutter 24. This shutter 24 is intended for interrupting the beam 42 when a local structural modification is detected on the surface 5.

In an embodiment variation, the shutter 24 is replaced with means of application of an electrical field perpendicular to the direction 52 of the beam 42, whereas the application and the withdrawal of this electrical field play respectively the part of closing and opening the shutter 24.

The beam 42 is directed towards guiding means, guiding the beam 42 towards the surface 5 to be treated. These guiding means consist advantageously of second means of application 23 of a uniform magnetic field 36, comprising two opposite coils 34 and 35 or permanent magnets. The magnetic field 36 being preferably perpendicular to the direction 52 of propagation of the beam 42, thus directs the beam 42 in a direction 53 towards the surface 5, preferably in normal incidence.

In an embodiment variation, the guiding means consist of means of application of an electrical, static or pulsed, field.

Preferably, interrupting means of the beam are also available downstream of the coils 34 and 35.

The local structural modification device also comprises, advantageously, a spatial localisation system of the beam 42, consisting for example of one or several collimators 25, 26. For great accuracy treatment, the collimators are nanometric, whereas the application and the withdrawal of this electrical field play respectively the part of closing and opening the shutter 24.

The beam 42 is directed towards guiding means, guiding the beam 42 towards the surface 5 to be treated. These guiding means consist advantageously of second means of application 23 of a uniform magnetic field 36, comprising two opposite coils 34 and 35 or permanent magnets. The magnetic field 36 being preferably perpendicular to the direction 52 of propagation of the beam 42, thus directs the beam 42 in a direction 53 towards the surface 5, preferably in normal incidence.

In an embodiment variation, the guiding means consist of means of application of an electrical, static or pulsed, field.

Preferably, interrupting means of the beam are also available downstream of the coils 34 and 35.

The local structural modification device also comprises, advantageously, a spatial localisation system of the beam 42, consisting for example of one or several collimators 25, 26. For great accuracy treatment, the collimators are nanometric.

The wafer 1 acting as a target is mounted on a translator 27, which enables movements along two directions 37 and 38 orthogonal to one another, and perpendicular to the direction 53 of the beam 42. The translator 27 comprises for example two piezoelectric quartzes or two ceramics.

In the implementation with a contact free interaction, an electrical field for deceleration of the ions of the beam 42 is applied in the vicinity of the target, by biasing said target. This electrical field decelerates sufficiently the ions of the beam 42 so that said ions extract electrons from the surface 5 without any contact with this surface and are backscattered in the form of hollow atoms.

This electrical deceleration field provides the ions with an energy which can be as low as 0.025 eV/q, in a controlled fashion. The electrical field can be applied by means of a plane capacitor with a potentiometer.

In an embodiment variation, deceleration does not take place on the target, by at some point of the beam line, by biasing the line.

The hollow atoms backscattered by the surface 5 form a beam 43, which goes into a direction 54 parallel to the direction 53 and in opposite direction to the beam 42. The beam 43 of hollow atoms goes then through the collimators 25 and 26, the shutter 24 and the means of application 23 of the magnetic field 36, in the example illustrated. This magnetic field 36 diverts the beam 43 in a direction 55, towards a detection surface 28.

The detection surface 28 gives the position, and advantageously the speed and the charge, of the hollow atoms of the incident beam 43. This detection surface 28 can be for example a grid of chaneltrons.

The local structural modification device also comprises a photon measuring device 49, notably for X rays, emitted when electrons leave an electronic layer for another layer of the hollow atoms of the beam 43 and/or hollow atoms formed in the surface 5.

Advantageously, the local structural modification device also comprises a detection system 45 detecting electrons emitted by Auger effect by the hollow atoms, etched hydrogen cores or atoms of the target which have been expelled from the surface 5, a sheaf of emitted electrons, photons emitted by atoms of the etching surface and/or an electrical charge appearing on the target.

In a contact embodiment, but without any penetration of the surface 5, the decelerating means are also present and actuated in the etching device. In another embodiment, with contact and penetration, the decelerating means are suppressed or deactivated, or leave sufficient energy to the ion beam 42 to penetrate the surface 5.

The beams 41, 42 and possibly 43 and the surface 5 of the wafer 1 are preserved from the surrounding atmosphere by a vacuum enclosure. The local structural modification device also comprises a treatment unit 29 connected to the shutter 24, to the translator 27, to the detection surface 28, to the detection system 45 and to the measuring device 49. This treatment unit 29 receives signals from the detection surface 28, from the detection system 45 and from the measuring device 49, and is capable of controlling the opening and the closing of the shutter 24 as well as displacements of the translator 27.

The local structural modification device is preferably completed by a tunnel effect microscope and/or an atomic force microscope, performing local checks of topographic and/or electrical conductivity of the treated surface 5.

Obviously, it is possible to keep only certain detecting means, according to the applications contemplated as well as the nature and the accuracy of the results desired.

In operation for an interaction without penetration of the surface 5, during a local structural modification step 18 (FIG. 3), the following operations are performed in succession. The beam 41 of multicharged positive ions is generated by means of the ion source 20, an ionic specie of this beam 41 is selected by the means of application 21 of the magnetic field 33, the beam 42 obtained is guided towards the surface 5 by the means of application 23 of the magnetic field 36 by conducting direct position control by the system 22 and spatial localisation by the collimators 25 and 26, then the beam 42 is slowed down.

Figure 5:
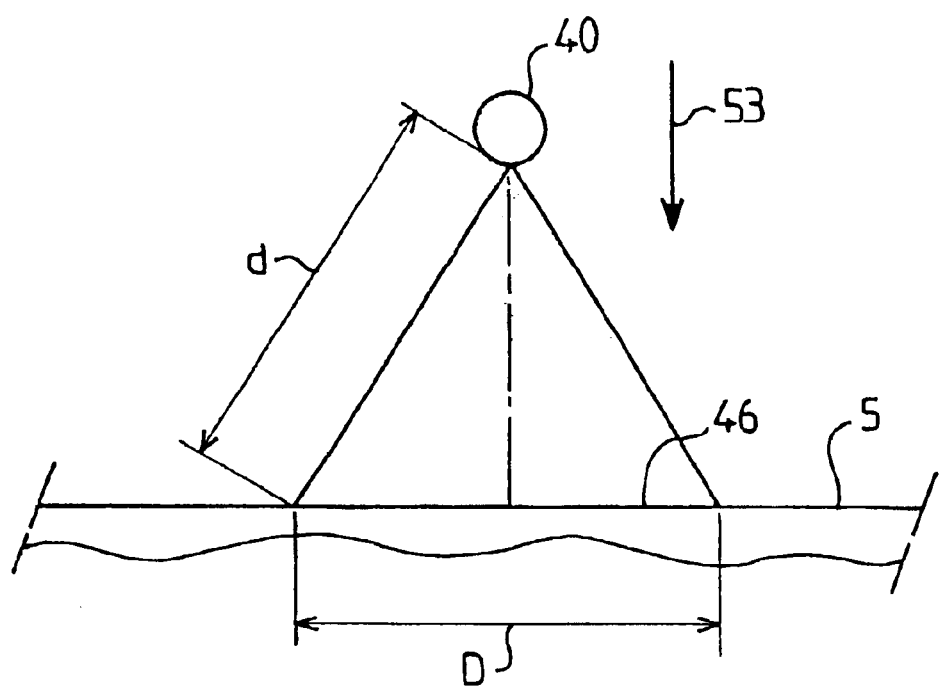
FIG. 5 represents the interaction of a multicharged positive ion with the surface of the wafer of FIG. 1, during the application of the method according to the invention.

When the ions of the beam 42 are close enough to the surface 5, they start to interact with said surface. The ions may capture the electrons of the wafer 1 as soon as they reach a capturing zone extending up to a distance d above the surface 5. Thus, when an ion 40 penetrates the capturing zone, it interacts with a portion 46 of this surface 5 delineating approximately a disk with diameter D having contours at a distance d from the ion 40, as represented on FIG. 5.

The ion 40 attracts and extracts superficial electrons from the portion 46 as it approaches in the capturing zone. This approach is controlled by adjusting the kinetic energy of the ion 40 thanks to the electrical deceleration field. The ion 40 captures electrons which transforms said ion into a hollow atom. This hollow atom is then backscattered without contact by a trampoline effect when the experimental conditions allow it and it is directed towards the detection surface 28.

The extraction of electrons from the surface 5 causes local rupture of the crystalline structure of the diamond, responsible for its very high resistivity. This physical phenomenon causes local change of electrical properties, which leads to the formation of a conductive layer inside the very insulating diamond layer 3.

The local structural modification is based upon the succession and the repetition of four operations 13–16 (FIG. 3), controlled by the treatment unit 29.

In a first operation 13, one detects he arrival on the detection surface 28 of the particles issued from the surface 5, the emission, in the vicinity of the surface of photons, preferably of a spectrum of X rays or of electrons, by means of the measuring device 49 and/or one or several signals generated by the detection system 45. The treatment unit 29 receives thus one or several signals corresponding to these detections. In a second operation 14, one then interrupts the arrival of the beam 42 on the target, by controlling the closing of the shutter 24. In a third operation 15, one then triggers the controlled motion of the translator 27, over a distance advantageously in the order of the nanometre. In a fourth operation 16, it controls the opening of the shutter 24, so that the beam 42 can again reach the surface 5.

By repeating the operations 13 to 16, one generates a local structural modification in the zones corresponding to the preset conductive portions. One can thus obtain the wafer 1A with conductive islands 6 or the wafer 1B with conductive lines 7, by a succession of local interactions a very well defined spots.

Preferably, one checks at a later stage 17 the surface 5 for electrical conductivity locally, by means of tunnel effect and/or atomic force microscopes.

In order to implement the method with penetration of the surface 5 by the ions of the beam 42, one can deactivate the deceleration means. The interaction between each ion 40 and the surface 5 is potential in a first step (remote interaction), then kinetic in a second step (penetration of the surface 5). The pieces of information used come from the detection system 45 and from the measuring device 49, as well as possibly from the detection surface 28, whereas atoms or ions are recovered after expulsion from the surface 5.

The local structural modification device detailed above can also be used for a random treatment, whereas the treatment unit 29 then simply controls movements of the translator 27 without taking into account the detection results. The shutter 24 is then deactivated. Such an implementation is advantageous for speed reasons, even if it does not enable to control the locations of the conductive zones on the surface 5. Preferably, the ions of the beam 42 are then sent at the same time into different spots on the surface 5 (rather than one after another).

Moreover, the local structural modification device can enable to treat fractions 9 of the surface 5, in order to provide a wafer of the type 2C.

What is claimed is:

1. A method for treating an insulating surface having a diamond structure, comprising the following steps:
    producing ions, each having at least three positive charges, and
    sending a beam of said multicharged positive ions towards a diamond surface causing over at least one zone of the diamond surface, a local structural modification making said zone conductive by at least extracting electron of the diamond surface without contacting the diamond surface, each ion having a charge, a kinetic energy and an incidence such that the local structural modification extends over a surface area greater than 4 atomic surfaces and smaller than 22,500 $nm^2$.

2. A treatment method according to claim 1, wherein said beam is sent in order to form at least one conductive island with a diameter smaller than 150 nm.

3. A treatment method according to claim 2, wherein said at least one conductive island has a diameter smaller than 10 nm.

4. A treatment method according to claim 3, wherein said at least one conductive island is used as at least one electron tank.

5. A treatment method according to claim 2, wherein said at least one conductive island is used as at least one reservoir for replenishing a cold cathode.

6. A treatment method according to claim 1, wherein the beam is sent in order to form conductive lines delineating insulating patterns.

7. A treatment method according to claim 1, wherein said beam is sent in order to make at least one fraction of the diamond surface conductive.

8. A treatment method according to any of claim 2, 3, or 5, wherein the local structural modification is performed on a random basis.

9. A treatment method according to claim 1, wherein the beam is bent so that, in addition, it contacts the surface and penetrates said surface.

10. A treatment method according to claim 9, wherein said ions with an initial kinetic energy ranging between 5 eV/q and 500 keV/q are generated.

11. A treatment method according to claim 1, wherein the beam is applied a deceleration voltage close to the diamond surface in order to confer to the ions of the beam a controlled average speed, whereas said ions extract electrons from the diamond atoms without contacting the diamond surface and therefore modify links between said atoms.

12. A treatment method according to claim 11, wherein said ions are slowed down so that they have dose to the diamond surface a kinetic energy ranging between $5.10^{-2}$ eV/q and 5 eV/q.

13. A treatment method according to claim 1, wherein the diamond surface is a monocrystalline diamond surface.

14. A treatment method according to claim 1, wherein the diamond surface is a polycrystalline diamond surface.

15. A treatment method according to claim 14, wherein the diamond surface is a layer deposited on a substrate.

16. A treatment method according to claim 1, wherein the diamond surface is an amorphous carbon sp3 surface.

17. A treatment method according to claim 13, 14 or 16, wherein the diamond surface is passivated by an atomic monolayer.

18. A diamond surface delineating conductive islands each with a diameter greater than 2 atomic distances and smaller than 10 nm.

19. A diamond surface according to claim 18, wherein each of said islands has a diameter ranging between 2 and 6 nm.

20. A diamond surface according to claim 18 or 19, wherein said islands have conductive properties similar to those of graphite.

21. A method of making electron tanks in microelectronics, comprising providing the diamond surface according to claim 18 or 19 with said conductive islands as the electron tanks.

22. An application of the method according to claim 1 to the production of cold cathodes, notably for flat screens.

23. A treatment method according to claim 1, wherein the local structural modification extends over a surface area greater than 10 atomic surfaces of said diamond.

24. A treatment method according to claim 3, wherein said conductive islands have a diameter ranging between 2 and 6 nm.

25. A treatment method according to claim 14, wherein the diamond surface is a polycrystalline diamond surface obtained by a Chemical Vapor Deposition technique or High Pressure High Temperature technique.

26. A treatment method according to claim 17, wherein the diamond surface is passivated by an atomic monolayer made of hydrogen or oxygen.

27. A diamond surface according to claim 18, delineating consuctive islands with a diameter greater than 3 atomic distances.

* * * * *